(12) United States Patent
Bushnell et al.

(10) Patent No.: US 9,557,593 B2
(45) Date of Patent: Jan. 31, 2017

(54) TRANSPARENT STRUCTURES FILLED WITH ELECTRICALLY ACTIVE FLUID

(71) Applicant: APPLE INC., Cupertino, CA (US)

(72) Inventors: Tyler S. Bushnell, Mountain View, CA (US); Samuel Bruce Weiss, Los Altos Hills, CA (US); Benjamin J. Kallman, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/732,583

(22) Filed: Jun. 5, 2015

(65) Prior Publication Data

US 2016/0274408 A1    Sep. 22, 2016

Related U.S. Application Data

(60) Provisional application No. 62/134,195, filed on Mar. 17, 2015.

(51) Int. Cl.

| | | |
|---|---|---|
| *G02F 1/1335* | (2006.01) | |
| *H01R 12/00* | (2006.01) | |
| *G02F 1/1333* | (2006.01) | |
| *H05K 9/00* | (2006.01) | |
| *G01D 5/12* | (2006.01) | |
| *H01B 7/00* | (2006.01) | |

(52) U.S. Cl.
CPC .......... *G02F 1/133377* (2013.01); *G01D 5/12* (2013.01); *G02F 1/1336* (2013.01); *G02F 1/133514* (2013.01); *G02F 1/133528* (2013.01); *H01B 7/0027* (2013.01); *H05K 9/0071* (2013.01); *G02F 2001/133624* (2013.01)

(58) Field of Classification Search
CPC ................ G02F 1/133615; G02F 1/133603; G02F 1/133604; G02F 1/133608; G02B 6/0038; H05K 3/365; H05K 3/326; H05K 1/118; H01R 12/62; H01R 12/79
USPC ....................................... 349/61; 439/67, 77
See application file for complete search history.

(56) References Cited

U.S. PATENT DOCUMENTS

| | | | | | |
|---|---|---|---|---|---|
| 4,536,727 | A | * | 8/1985 | Romano | ................ H01H 29/22 200/220 |
| 8,862,197 | B2 | * | 10/2014 | Kamath | ............. A61B 5/14865 600/345 |

* cited by examiner

*Primary Examiner* — Mike Qi
(74) *Attorney, Agent, or Firm* — Sterne, Kessler, Goldstein & Fox P.L.L.C.

(57) ABSTRACT

Transparent structures containing a transparent electrically conductive fluid are used for aesthetically appealing designs and/or improved fatigue performance. Some structures have multiple isolated conductors while others have a single conductive area that may be used as a transparent antenna or a transparent EMI shield. Other embodiments employ fluids that change crystalline structure under an applied voltage such that a structure can change color and/or display a message.

20 Claims, 9 Drawing Sheets

10
TRANSPARENT STRUCTURES FILLED WITH ELECTRICALLY ACTIVE FLUID

CROSS REFERENCE TO RELATED APPLICATIONS

This application claims priority to Provisional Application No. 62/134,195, filed Mar. 17, 2015, titled "TRANSPARENT STRUCTURES FILLED WITH ELECTRICALLY ACTIVE FLUID", which is hereby incorporated by reference in its entirety for all purposes.

FIELD

The described embodiments relate generally to three-dimensional optically transparent structures filled with an electrically active fluid. More particularly, the present embodiments relate to optically transparent structures that may be filled with an electrically conductive fluid or a fluid that changes crystalline structure under an applied voltage.

BACKGROUND

To meet the demands of consumers, electronic devices are required to be increasingly thin, lightweight and low cost with constantly increasing feature sets. Because of these demands, the packaging densities of electronic devices are increasing and the area available for interconnects, sensors and structures is being reduced. To meet the needs of future electronic devices new electronic structures and interconnects will be required.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Certain embodiments of the present invention relate to three-dimensional transparent structures filled with an electrically active fluid (e.g., a fluid that responds to an applied voltage by conducting current or changing crystalline structure). In some embodiments the electrically active fluid can be electrically conductive while also being transparent. The transparent fluid may be encased in a shell that is also transparent, enabling embodiments of the invention to provide optically transparent electrically conductive components. Such components may be useful in a variety of applications including optical sensors and aesthetically pleasing designs, as discussed in more detail below. In other embodiments the electrically conductive fluid may be opaque and employed in a flexible electrical interconnect structure having high mechanical fatigue performance. In yet further embodiments the electrically active fluid may change crystalline structure in response to an applied voltage, enabling a transparent component to change colors for aesthetic appeal. The foregoing embodiments are examples to illustrate some of the benefits of the invention; myriad other designs, geometries and configurations are possible and are within the scope of this disclosure. While the present invention can be useful for a wide variety of applications, some embodiments of the invention are particularly useful for electronic devices, as described in more detail below. The examples described below are only to illustrate the inventive concepts and in no way limit the applicability of the embodiments to alternatives, modifications, and equivalents.

Figure 1A:
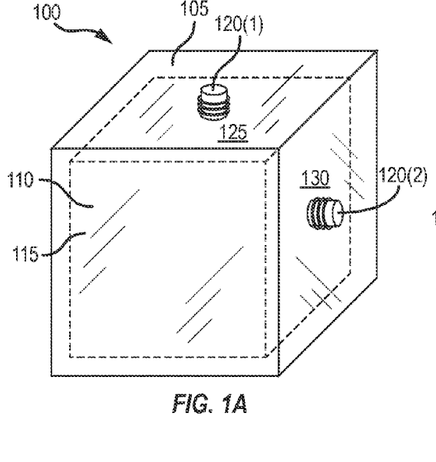
FIG. 1A illustrates an isometric view of transparent deformable cube filled with a transparent electrically conductive fluid according to an embodiment of the invention.

Now referring to FIG. 1A, an example embodiment of a three-dimensional transparent structure in the shape of a cube is shown. The cube may be made from a transparent flexible material and filled with a transparent electrically conductive fluid as described in greater detail below. Cube 100 may have an optically transparent shell 105 comprising six walls forming a cavity 110 therein. Shell 105 may be made from a flexible electrically insulating material as discussed in more detail below. Cavity 110 may be filled with an optically transparent electrically conductive fluid 115 as also discussed in more detail below. In other embodiments, electrically conductive fluid 115 may be translucent or opaque. A first electrically conductive plug 120(1) may be disposed in a top wall 125 of shell 105 penetrating the electrically insulative shell and making electrical contact with electrically conductive fluid 115. A second electrically conductive plug 120(2) may be disposed in a first side wall 130 of shell 105, penetrating the electrically insulative shell and making electrical contact with electrically conductive fluid 115. Thus, electrical continuity may be formed between first and second electrically conductive plugs, 120(1), 120(2), respectively by forming a conductive path through electrically conductive fluid 115.

Figure 1B:
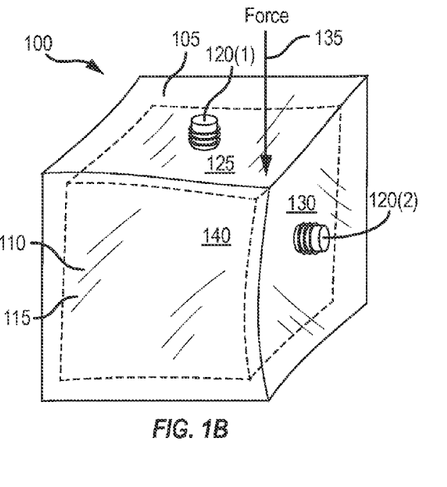
FIG. 1B illustrates an isometric view of the transparent deformable cube illustrated in FIG. 1A in a deformed state according to an embodiment of the invention.

Now referring to FIG. 1B, cube 100 is illustrated in a deformed state caused by a force applied to a corner of the cube. During deformation from the geometry shown in FIG. 1A to the geometry shown in FIG. 1B, electrical continuity is maintained between first and second electrically conductive plugs 120(1), 120(2), respectively. More specifically, a force along arrow 135 has been place on a corner of cube 100 causing first and second side walls 130, 140, respectively, and top wall 125 to deform. As described above, in some embodiments shell 105 may be made from a flexible material, allowing cube 100 to deform. During the deformation, electrically conductive fluid 115 remains in contact with first and second electrically conductive plugs 120(1), 120(2), respectively, such that electrical continuity between the first and second plugs is maintained. Similarly, once the force is removed, electrical continuity between first and second electrically conductive plugs 120(1), 120(2), respectively, is maintained while cube 100 regains its original shape shown in FIG. 1A. In an alternative embodiment, shell 105 may be made from a material that remains in the deformed state illustrated in FIG. 1B after the force is removed. In this embodiment electrical conductivity may also be maintained between first and second electrically conductive plugs 120(1), 120(2), respectively.

Figure 6:
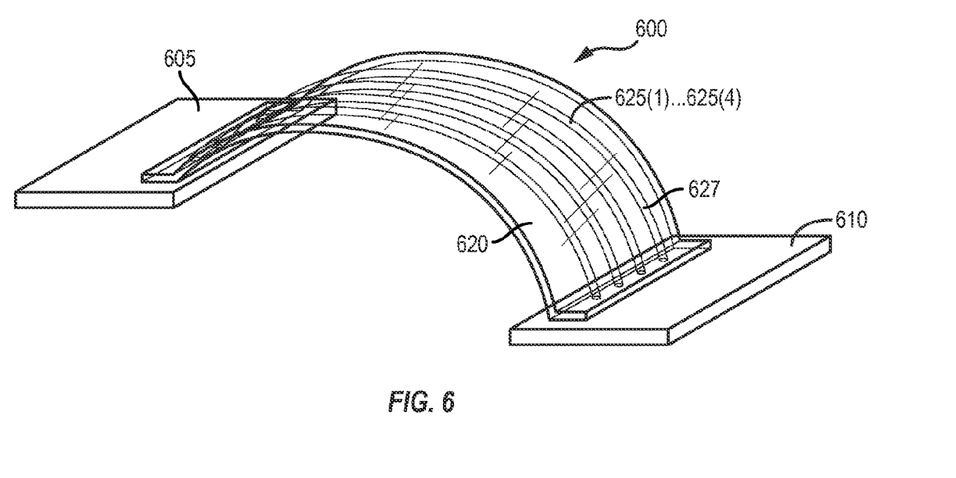
FIG. 6 illustrates an isometric view of a flexible circuit in accordance with an embodiment of the invention.
Figure 15:
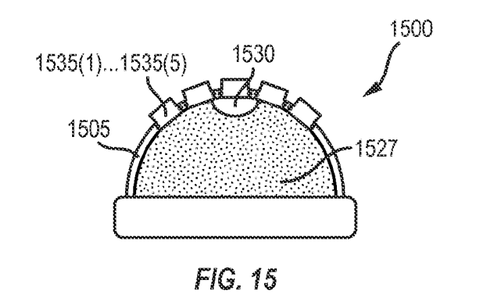
FIG. 15 illustrates a cross-sectional view of a sensor in accordance with an embodiment of the invention.
Figure 16:
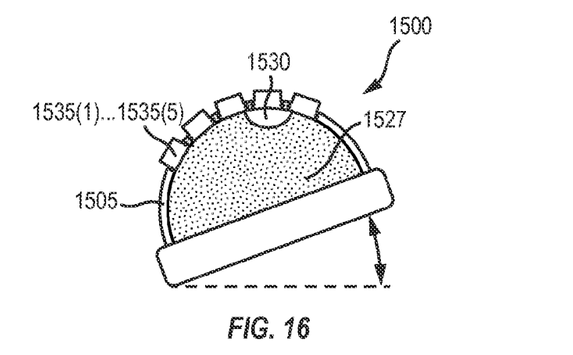
FIG. 16 illustrates a rotated cross-sectional view of the sensor shown in FIG. 15 in accordance with an embodiment of the invention.

Cube 100 is an embodiment illustrating a general concept. Alternatives, modifications, and equivalents are included within the spirit and scope this disclosure. For example, a modification of this concept may be useful for a touch sensor as illustrated in FIGS. 9-12. Other embodiments may use alternative concepts for an electromagnetic interference shield as illustrated in FIG. 6 or a tilt sensor as illustrated in FIGS. 15-16. Myriad other embodiments are possible and are within the scope of this disclosure.

Figure 2A:
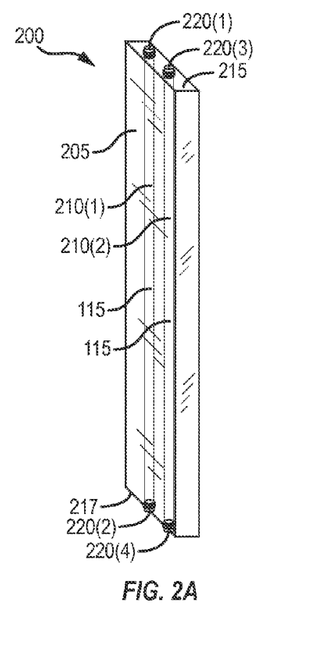
FIG. 2A illustrates an isometric view of transparent deformable panel having two transparent electrically conductive channels according to an embodiment of the invention.

Now referring to FIG. 2A, another embodiment of a three-dimensional transparent structure filled with an electrically conductive fluid is illustrated. Panel 200 may have an optically transparent and elongated shell 205 that may be made from a flexible electrically insulating material. Shell 205 may have first and second elongated cavities 210(1), 210(2), respectively, formed within it and extending from a first end 215 of shell 205 to a second end 217 of the shell. A first electrically conductive plug 220(1) may be secured in first end 215 of shell 205 and a second electrically conductive plug 220(2) may be secured in second end 217 of the shell such that first elongated cavity 210(1) is sealed. First elongated cavity 210(1) may be filled with an optically transparent electrically conductive fluid 115 such that the fluid is in contact with first and second electrically conductive plugs 220(1), 220(2), respectively, forming an electrically conductive channel between the plugs.

Similarly, third and fourth electrically conductive plugs 220(3), 220(4), respectively may seal second elongated cavity 210(2) that also contains optically transparent electrically conductive fluid 115. Optically transparent electrically conductive fluid 115 may be in contact with third and fourth electrically conductive plugs 220(3), 220(4), respectively forming an electrically conductive channel between the third and fourth plugs. Therefore, elongated shell 205 may have two parallel and electrically isolated electrically conductive channels that extend from first end 215 to second end 217.

Figure 2B:
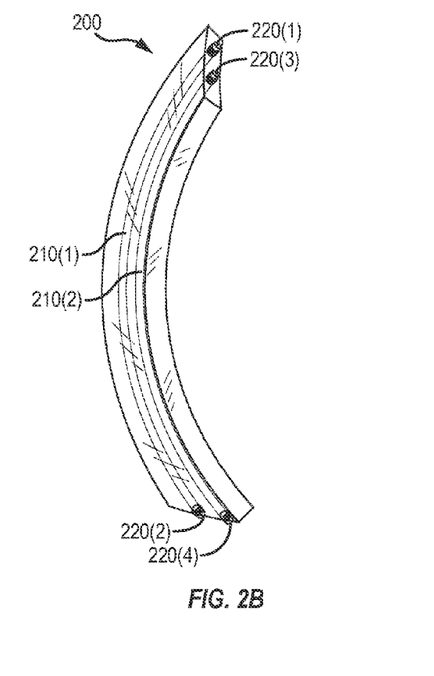
FIG. 2B illustrates an isometric view of the transparent deformable panel illustrated in FIG. 2A in a deformed state according to an embodiment of the invention.

Now referring to FIG. 2B, panel 200 is illustrated in a deformed state. During deformation from the geometry shown in FIG. 2A to the geometry shown in FIG. 2B, electrical continuity is maintained between first and second electrically conductive plugs 220(1), 220(2), respectively and third and fourth electrically conductive plugs 220(3), 220(4), respectively. More specifically, panel 200 has been deflected from a relatively flat state shown in FIG. 2A to an arcuate shape shown in FIG. 2B. During and after the deformation, electrical continuity is maintained between first and second electrically conductive plugs 220(1), 220(2), respectively, and between third and fourth electrically conductive plugs, 220(3), 220(4), respectively. Thus, transparent and electrically conductive fluid 115 deforms with first and second elongated cavities 210(1), 220(2), respectively, such that electrical continuity is maintained when panel 200 is deformed.

Figure 14:
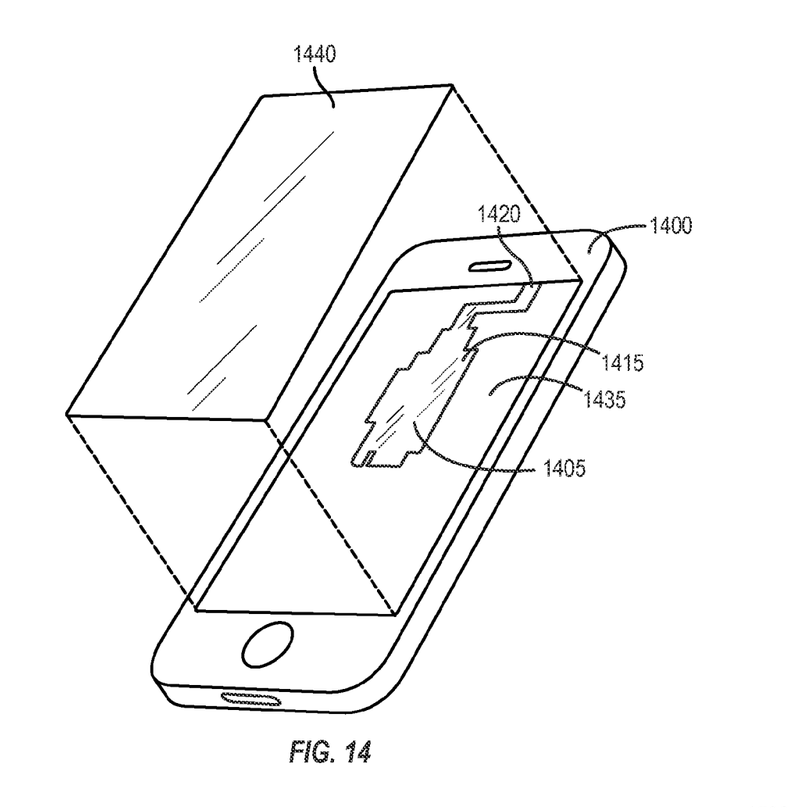
FIG. 14 illustrates an isometric view of an electronic device with an antenna in accordance with an embodiment of the invention.

Panel 200 is an embodiment illustrating a general concept. Alternatives, modifications, and equivalents are included within the spirit and scope this disclosure. For example, a modification of the concept may be useful for a watch band as illustrated in FIGS. 3A-5. Other embodiments may employ alternative concepts for an antenna as illustrated in FIG. 14. Myriad other embodiments are possible and are within the scope of this disclosure.

Figure 3A:
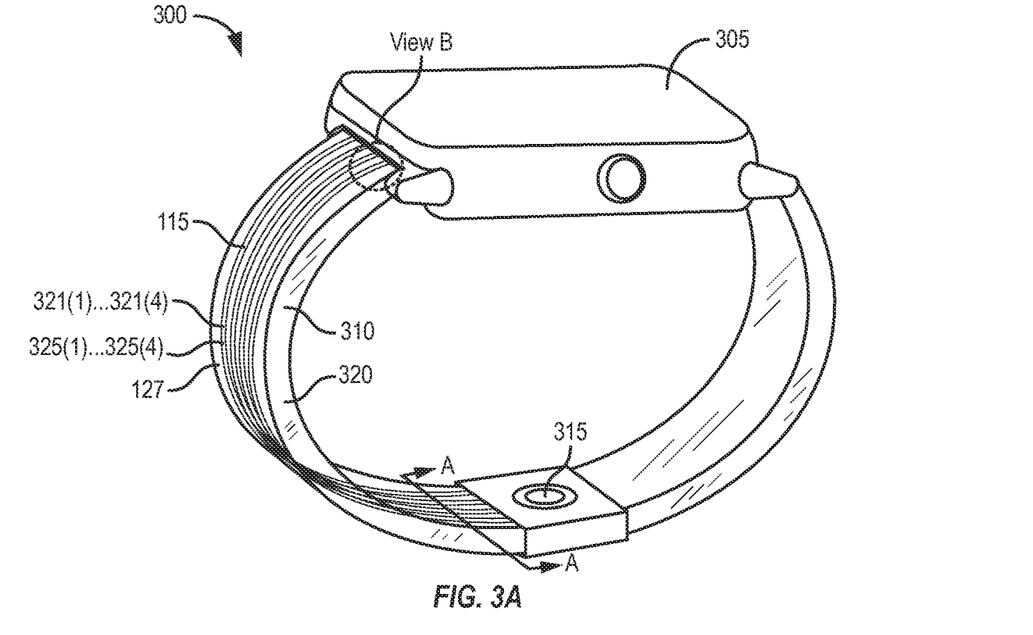
FIG. 3A illustrates an isometric view of a wearable device in accordance with an embodiment of the invention.

Now referring to FIG. 3A, a wearable electronic device is shown that may incorporate one or more embodiments. The wearable device may have a substantially transparent band that provides electrical communication between the wearable device display and a user pulse sensor located on a distal portion of the band. The communication may be performed using one or more transparent elongated cavities in the band that are filled with a transparent electrically conductive fluid forming one or more electrically conductive channels. The transparent band with electrically conductive channels may provide the wearable device with an aesthetically appealing design and improved mechanical fatigue performance, as described in more detail below.

More specifically, wearable device 300 may have a display portion 305 that may contain a display screen, a processor and other electronic components (not shown). Display portion 305 may be connected to a transparent band 310 such that wearable device 300 can be secured to a user's wrist. A sensor 315 may be located on a distal portion of band 310 and used to sense the user's pulse, for example. In one embodiment, band 310 may be a flexible three-dimensional substantially transparent structure having an optically transparent shell 320 with multiple elongated cavities 321(1) . . . 321(4) disposed within it. Elongated cavities 321(1) . . . 321(4) may be filled with a transparent electrically conductive fluid, 115 forming one or more electrically conductive channels 325(1) . . . 325(4) as described in more detail below. Electrically conductive channels 325(1) . . . 325(4) may be used by display portion 305 to communicate with sensor 315. In the embodiment illustrated in FIG. 3A, four conductive channels 325(1) . . . 325(4) are depicted, however other embodiments may have fewer or more conductive channels. Shell 320 may be made from a rigid, a semi-rigid or a flexible material. Thus, band 310 may be substantially transparent providing an aesthetically appealing appearance while providing electrical communication between display portion 305 and sensor 315. Further, since conductive channels 325(1) . . . 325(4) are filled with a fluid, band 310 may have substantially improved mechanical fatigue performance as compared to a band with metallic wire conductors that are subject to fatigue failure.

Figure 3B:
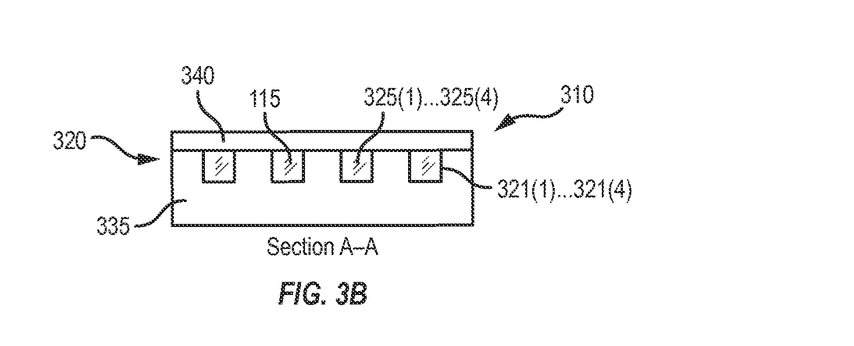
FIG. 3B illustrates a cross-sectional view of the wearable device band shown in FIG. 3A in accordance with an embodiment of the invention.

Now referring to FIG. 3B, section A-A of band 310 (see FIG. 3A) is illustrated. In one embodiment, shell 320 may include a base portion 335 having elongated cavities 321(1) . . . 321(4) formed along a length of band 310. Elongated cavities 321(1) . . . 321(4) may be formed, for example, during a molding or an extruding process. As discussed above, elongated cavities 321(1) . . . 321(4) may be filled with transparent electrically conductive fluid 115. A cover 340 may be secured to base portion 335 such that transparent electrically conductive fluid 115 is contained within elongated cavities 321(1) . . . 321(4) forming conductive channels 325(1) . . . 325(4). Transparent electrically conductive fluid 115 may be disposed within elongated cavities 321(1) . . . 321(4) prior to securing cover 340 or after securing the cover. Cover 340 may be secured to base portion 335 using, for example, an adhesive, bonding, fusing or welding process. In this embodiment, conductive channels 325(1) . . . 325(4) may have a rectangular cross-section as shown in FIG. 3B. However, in other embodiments conductive channels 325(1) . . . 325(4) may have a different cross-section and may be manufactured using an alternative process.

Figure 3C:
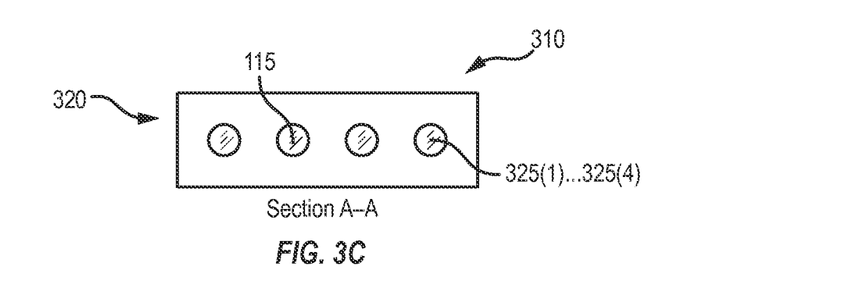
FIG. 3C illustrates a cross-sectional view of the wearable device band shown in FIG. 3A in accordance with an embodiment of the invention.

Now referring to FIG. 3C, another embodiment of section A-A through band 310 (see FIG. 3A) is illustrated. In this embodiment conductive channels 325(1) . . . 325(4) have a circular cross section and shell 320 may be substantially unitary. As described above, conductive channels 325(1) . . . 325(4) may be filled with a transparent electrically conductive fluid 115. Transparent electrically conductive fluid 115 may be disposed within conductive channels 325(1) . . . 325(4) during the manufacturing of shell 320 or after it is manufactured. For example, transparent electrically conductive fluid 115 may be deposited during extrusion molding of shell 320, or the fluid may be disposed within the conductive channels after they are formed in the shell.

Figure 4:
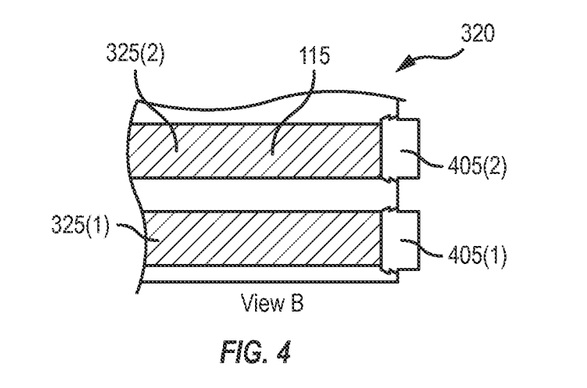
FIG. 4 illustrates a cross-sectional view of the wearable device band shown in FIG. 3A in accordance with an embodiment of the invention.

Now referring to FIG. 4, an enlargement of View-B of shell 320 in FIG. 3A is shown. As discussed above, conductive channels 325(1), 325(2) are filled with a transparent electrically conductive fluid 115. Electrically conductive plugs 405(1), 405(2) may be disposed within conductive channels 325(1), 325(2) and configured to make electrical contact with transparent electrically conductive fluid 115. In some embodiments, electrically conductive plugs 405(1), 405(2) may be disposed in both distal ends of conductive channels 325(1), 325(2) such that transparent electrically conductive fluid 115 is contained within the channels and electrical contact may be made from one end of band 310 (see FIG. 1) to the other end through the fluid. That is, a combination of two conductive plugs disposed on either end of a conductive channel 325(1), 325(2) may form a continuous electrical conductor similar in function to a metallic wire and as shown earlier in FIGS. 2A-2B. Electrically conductive plugs 405(1), 405(2) may be secured within conductive channels 325(1), 325(2) with a press-fit, bonding, welding or fusing process. Electrically conductive plugs 405(1), 405(2) may then be electrically coupled to wearable device display portion 305 (see FIG. 3A) and/or sensor 315 forming a complete electrical circuit between the display and the sensor. In some embodiments, electrically conductive plugs 405(1), 405(2) may form a portion of an electronic connector that is coupled to band 310.

The combination of transparent shell 320 and transparent electrically conductive fluid 115 may provide band 310 (see FIG. 3A) with a substantially transparent and aesthetically pleasing appearance. In further embodiments, where shell 320 is made from a relatively soft material, band 310 (see FIG. 3A) may be able to withstand many cycles of deflection, such as when the band is secured to the user's wrist. Because the electrical conductors within band 310 are made with a fluid, and not a metallic wire, they are not subject to mechanical fatigue and fracture like the wire.

In further embodiments shell 320 may be made from an optically transparent and relatively rigid material such as, for example, polycarbonate or glass. Rigid embodiments may have a hardness from Shore A 100 to Shore D 100 and harder. In other embodiments conductive shell 320 may be made from an optically transparent semi-rigid material such as, for example, transparent nylon. Some semi-rigid embodiments may have a hardness from Shore A 40 to Shore A 100. In further embodiments shell 320 may be made from a flexible material such as, for example, a transparent silicone or an elastomer. Some flexible embodiments may have a hardness from a Shore 00 10 to Shore A 40. Further embodiments may have a hardness from Shore A 0 to Shore A 100. Myriad optically transparent or translucent materials may be used for shell 320 without departing from the invention. In some embodiments, shell 320 may be formed by injection molding, blow molding, casting or three-dimensional printing. Myriad materials and manufacturing methods may be used to form shell 320 and are within the scope of this disclosure.

In some embodiments, electrically conductive plugs 405(1), 405(2) may be made from an electrically conductive metal such as brass, copper, stainless steel or other metal. In other embodiments electrically conductive plugs 405(1), 405(2) may be made from an electrically conductive plastic such as, for example conductive nylon. In further embodiments electrically conductive plugs 405(1), 405(2) may be plated with one or more metals such as, for example, nickel, copper, gold, silver, palladium or other metal. In one embodiment, electrically conductive plugs 405(1), 405(2) may be made from a non-electrically conductive plastic that may be plated with one or more metals.

In further embodiments transparent electrically conductive fluid 115 may comprise water with one or more ionic compounds dissolved in it such as a salt or other compound making it electrically conductive. In yet further embodiments transparent electrically conductive fluid 115 may comprise tin-oxide that may be doped with antimony or phosphorous. In other embodiments transparent electrically conductive fluid 115 may be translucent or opaque, as in the embodiment below, comprising a metal or alloy such as for example, mercury. In other embodiments transparent electrically conductive fluid 115 may be what is known as an electrically conductive ink, or a liquid carrier filled with one or more types of electrically conductive particulates. Myriad electrically conductive fluids may be used and are within the scope of this disclosure.

Figure 5:
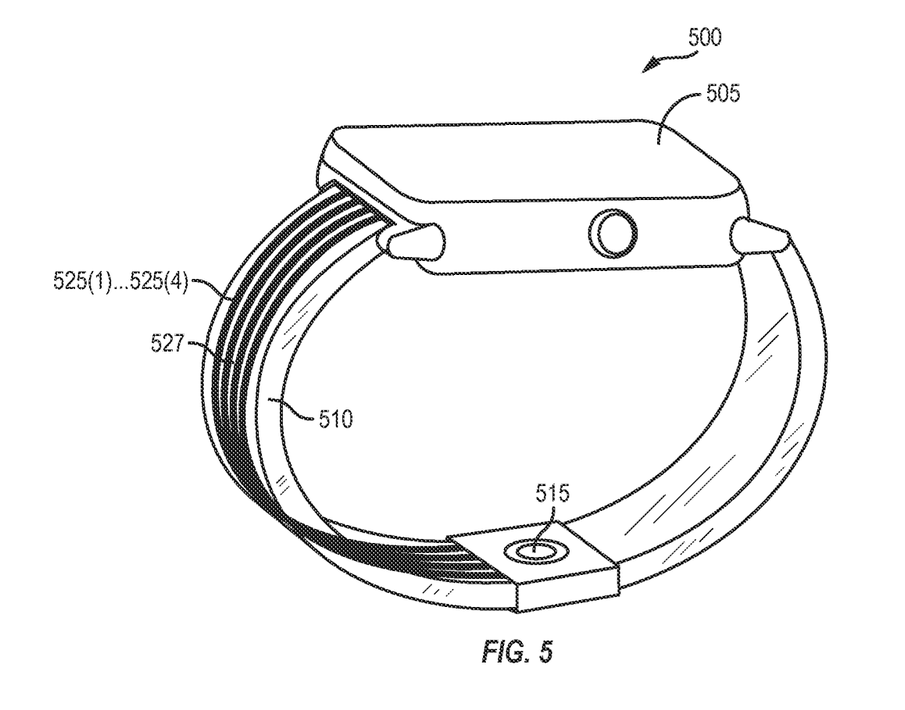
FIG. 5 illustrates an isometric view of a wearable device in accordance with an embodiment of the invention.

Now referring to FIG. 5, wearable device 500 may be similar to wearable device 300 illustrated in FIG. 3A, however wearable device 500 may employ an optically translucent or opaque electrically conductive fluid in the band as compared to wearable device 300 that employed an optically transparent electrically conductive fluid. Thus, wearable device 500 may have a band that is resilient to mechanical fatigue with visible conductive channels.

More specifically, wearable device 500 may have a display portion 505 that may be connected to a transparent band 510 such that wearable device 500 can be secured to a user's wrist. A sensor 515 may be located on a distal portion of band 510 and used to sense the user's pulse, for example. Band 510 may be a flexible three-dimensional substantially transparent structure having multiple electrically conductive channels 525(1) . . . 525(4) disposed within it. Electrically conductive channels 525(1) . . . 525(4) may be filled with a translucent or opaque electrically conductive fluid, 527 as described in more detail above. Electrically conductive channels 525(1) . . . 525(4) may be used by display portion 505 to communicate with sensor 515, or they may be used for other functions as described in more detail below.

Now referring to FIG. 6, a three-dimensional flexible electrical interconnect structure 600 that is similar to bands 310, 510 (see FIGS. 1 and 5) is illustrated. However, instead of being used as a wearable device band, structure 600 may be used to interconnect electronic components 605, 610. For example, in one embodiment structure 600 may be used to electrically interconnect two printed circuit boards 605, 610. Structure 600 may function similar to a flexible printed circuit board, however structure 600 uses fluid filled electrically conductive channels instead of metallic conductors such that it has high mechanical fatigue properties and/or is substantially transparent for aesthetic appeal.

More specifically, structure 600 may include a three-dimensional flexible shell 620 that may have multiple electrically conductive channels 625(1) . . . 625(4). Shell 620 may be manufactured from a material that is semi-rigid or flexible to allow it to deform without breaking, as discussed above. In one embodiment electrically conductive channels 625(1) . . . 625(4) may be filled with an electrically conductive fluid 627. In some embodiments fluid 627 may be opaque, while in other embodiments it may be translucent and in further embodiments is may be transparent. In some embodiments, a substantially transparent structure 600 (i.e., one that employs a translucent or transparent fluid 627) may be beneficial for applications requiring aesthetic appeal such as electronic devices, toys and games. Such applications may use structure 600 entirely for its aesthetic appeal (e.g., a computer with a viewing window showing the internal components where structure 600 is used to minimally obscure one's view) or for functional purposes (e.g., an LCD screen is illuminated through structure 600). Structure 600 may be manufactured using similar processes as discussed above. Such embodiments may have the benefit of being optically transparent and surviving many cycles of bending without fatigue damage since the conductors are composed of electrically conductive fluid. In further embodiments transparent structure 600 may conduct electrical signals in multiple dimensions instead of being limited to planar two-dimensional structures like flexible circuit boards.

Figure 7:
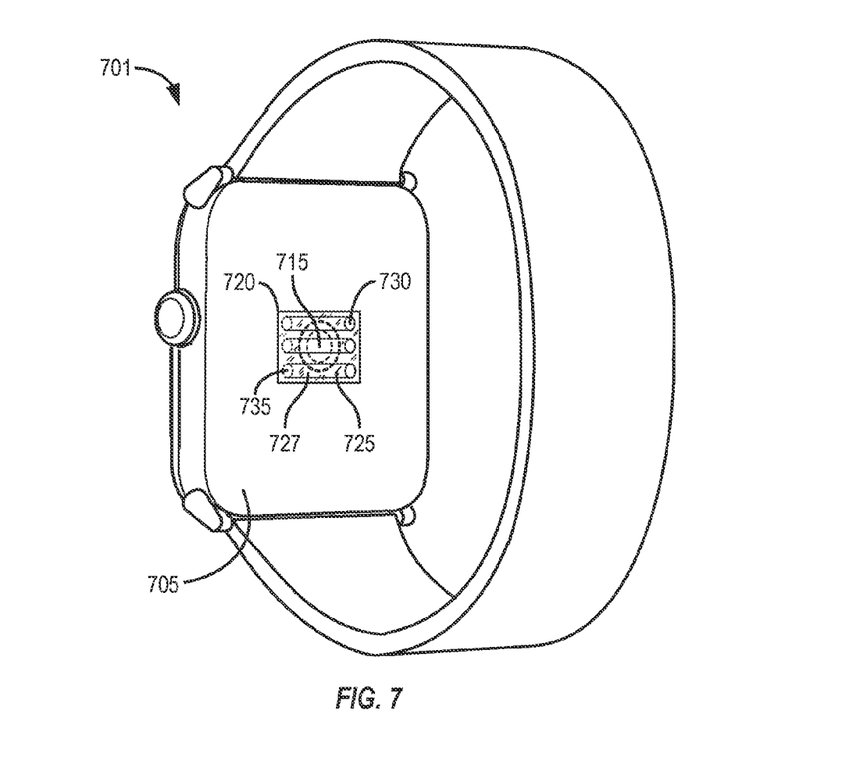
FIG. 7 illustrates an isometric view of a wearable device with an integrated sensor in accordance with an embodiment of the invention.

Now referring to FIG. 7, according to another embodiment of the invention, a transparent window with transparent electrical conductors may be used in the back of a wearable device such that an optical sensor can transmit and receive optical signals through the window and the conductors. More specifically, wearable device 701 may have a display portion 705 with an optical sensor 715 disposed within it. Optical sensor 715 may emit and/or receive a light beam through a transparent structure 720. For example, sensor 715 may be disposed within display portion 705 of wearable device 701 and transmit and receive light through structure 720 to determine a user's pulse. In some embodiments, structure 720 may not only act as a window, but may also function as an electrical connector from the outside of wearable device 701 to the inside of the wearable device. Structure 720 may have multiple external electrical contacts 730 that are accessible from the outside of wearable device 701. External electrical contacts 730 may be electrically coupled to internal contacts 735 by transparent electrically conductive channels 725. Transparent electrically conductive channels 725 may be filled with transparent electrically conductive fluid 727 providing electrical continuity between external electrical contacts 730 and internal electrical contacts 735. In some embodiments, transparent electrically conductive fluid 727 may be transparent only within the bandwidth of sensor 715 such that the sensor 715 may emit and/or receive light through transparent structure 720. More specifically, the combination of structure 720 being made from a transparent material and fluid 727 being transparent enables sensor 715 to transmit and receive light through the window which contains conductive channels 725.

Referring now to FIGS. 8-12, some embodiments may form user input devices such as touch sensitive "buttons" on a wearable device band or other electronic device. The user input devices may be employed by a user to change a state of the device, such as, for example answering a call, pausing a video or muting an alarm on a wearable device. In some embodiments employed on a wearable device, the user input devices as well as the wearable device band they are disposed on may be substantially transparent giving the wearable device aesthetic appeal. Transparent conductors, as discussed above, may be used to communicate with the user input devices to provide further aesthetic appeal. For example, in one embodiment the entire wearable device band may be substantially transparent, however when a user touches a region of the band near the display the wearable device may change states in response. Other user inputs may also be recognized such as a user sliding their finger along a portion of the band. The embodiments illustrated in FIGS. 8-12 may be manufactured using similar methods as those illustrated above, having a shell filled with an electrically conductive fluid that may be in contact with one or more electrically conductive plugs. User input devices may detect user input using pressure, capacitive or other types of sensing. In some embodiments the user input devices may employ an opaque fluid and be mostly visible, while in other embodiments they may employ a translucent or transparent fluid and be substantially transparent, except for the conductive plugs.

Figure 8:
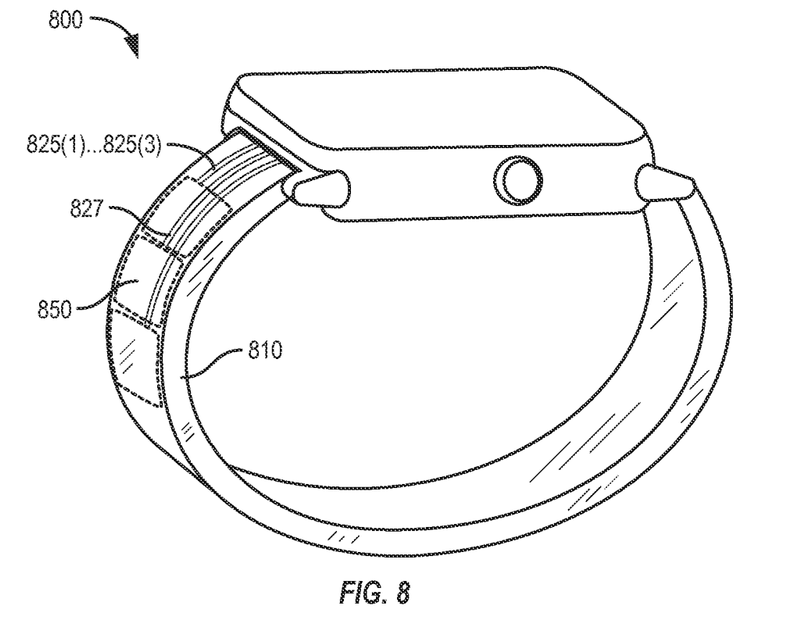
FIG. 8 illustrates an isometric view of a wearable device with user input areas on the band in accordance with an embodiment of the invention.

Now referring to FIG. 8, in one embodiment one or more user input devices 850 may be disposed on band 810 of wearable device 800. The user input device may be a region on the wearable device band that a user can lightly touch, or firmly depress to control the wearable device. In some embodiments the user input device may use a transparent electrically conductive fluid and be substantially transparent for aesthetic appeal. For example, user input devices 850 may enable a user to answer a call, to stop playing music or to show the current time by simply touching or depressing a particular region on the wearable device band. Other embodiments may have more or less user inputs and they may be used for myriad functions. Similar to embodiments discussed above, some user input devices may be visible while others may be translucent or mostly transparent. In one embodiment an optically transparent band 810 may be used with an optically transparent or translucent fluid to provide an aesthetically pleasing appearance to wearable device 800.

Wearable device 800 may be similar to wearable device 500 shown in FIG. 5 and have multiple conductive channels 825(1) . . . 825(3) filled with electrically conductive fluid 827 disposed within transparent band 810. However, in this embodiment, conductive channels 825(1) . . . 825(3) may be used to provide electrical connections to one or more transparent or semi-transparent input devices 850. Myriad methods may be used to make input devices 850. In one embodiment input devices 850 may be configured to detect a user's touch by a change in electrical resistance or mutual capacitance, as described in more detail below.

Figure 9:
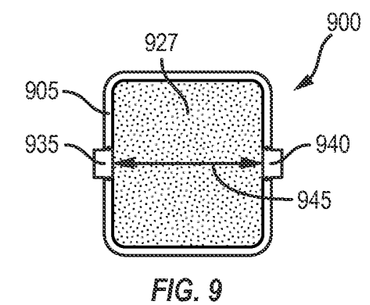
FIG. 9 illustrates a cross-sectional view of a sensor in accordance with an embodiment of the invention.
Figure 10:
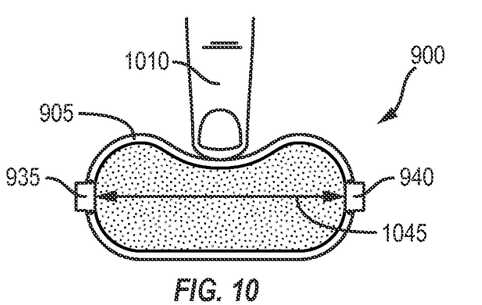
FIG. 10 illustrates a cross-sectional view of the sensor illustrated in FIG. 9 being depressed by a finger in accordance with an embodiment of the invention.

Now referring to FIGS. 9 and 10, a cross-section of an embodiment of a resistive-type user input device 900 is illustrated. FIG. 9 illustrates the user input device before being depressed and FIG. 10 illustrates the user input device after being depressed. An arrow is used to illustrate the increase in distance between two conductive plugs when the device is depressed by a user's finger. This illustration is an example and other geometries and configurations are within the scope of this disclosure. Such devices can be readily integrated by those of skill in the art into wearable device band 810 as illustrated in FIG. 8, or in any other device.

User input device 900 may be made from a flexible or semi-flexible transparent or translucent material as discussed above. Wall 905 may form a continuous enclosure that contains electrically conductive fluid 927. Wall 905 may have electrically conductive plugs 935, 940 configured to form an electrical connection to fluid 927. Plugs 935, 940 may be a first distance 945 apart, with only fluid 927 forming an electrical connection between them.

Now referring to FIG. 10, user input device 900 is illustrated in a deformed state, such as, for example when a user's finger 1010 depresses it. Wall 905 has deformed causing plugs 935, 940 to move apart to a second distance 1045 that is greater than first distance 945 (see FIG. 9). The greater distance between plugs 935, 940 causes the electrical resistance between the plugs to increase. The increase in resistance may be used to sense a user's touch on input device 900. In some embodiments the change in electrical resistance may be amplified and determined by the use of a Wheatstone bridge or other circuit. Thus, in some embodiments not only the depression of input device 900 may be determined, but the amount of depression and/or the applied force may be determined.

The deformation and distances 945, 1045 are exaggerated in FIGS. 9 and 10, thus much smaller changes in distance may be used. Other configurations are within the scope of this disclosure such as, but not limited to placing one plug 935 on the surface which the user depresses and placing the other plug 940 on the opposite wall. Myriad methods of making such an input device are within the scope of this disclosure. As discussed in more detail above, fluid 927 may be transparent, semi-transparent or opaque. Such methods may be used to form a substantially transparent or semi-transparent user input device where only plugs 935, 940 may be visible or opaque.

Figure 11:
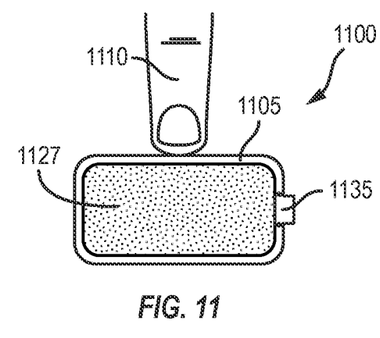
FIG. 11 illustrates a cross-sectional view of a sensor in accordance with an embodiment of the invention.

Referring now to FIG. 11, other embodiments may form a transparent capacitive-type user input device 1100. In one embodiment, a self or absolute capacitance type sensor may be formed where an object (e.g., a finger 1110 or a stylus) capacitively loads device 1100 or increases the parasitic capacitance to ground. In one embodiment, wall 1105 may form a continuous enclosure that contains electrically conductive fluid 1127. Wall 1105 may have electrically conductive plug 1135 configured to form an electrical connection to fluid 1127. Electrically conductive plug 1135 may be configured to make electrical contact with electrically conductive fluid 1127 such that the electrically conductive fluid may act as a sensor to detect user's 1110 touch on device 1100. As discussed in more detail above, fluid 1127 may be transparent, semi-transparent or opaque.

Figure 12:
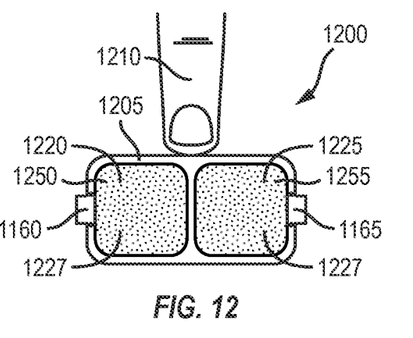
FIG. 12 illustrates a cross-sectional view of the sensor illustrated in FIG. 11 being touched by a finger in accordance with an embodiment of the invention.

Now referring to FIG. 12, in other embodiments a mutual capacitance type of input device 1200 may be formed. Input device 1200 is similar to input device 1100 illustrated in FIG. 11, however input device 1200 monitors mutual coupling between two adjacent electrodes, as discussed in more detail below. A user's interaction with input device 1200 is indicated by detecting a change in mutual capacitance between the two electrodes. In the embodiment illustrated in FIG. 12, an object (e.g., finger 1210 or conductive stylus) alters the mutual coupling between two or more electrodes 1220, 1225, which may be scanned sequentially. In one embodiment, wall 1205 may form a first continuous enclosure 1250 and a separate second continuous enclosure 1255, each enclosure containing electrically conductive fluid 1227. First and second enclosures 1250, 1255, respectively, filled with fluid 1227 may form electrodes 1220, 1225. First and second enclosures 1250, 1255, respectively, may each have an electrically conductive plug 1160, 1165, respectively, configured to form an electrical connection to fluid 1227. As discussed in more detail above, fluid 1227 may be transparent, semi-transparent or opaque.

Figure 13:
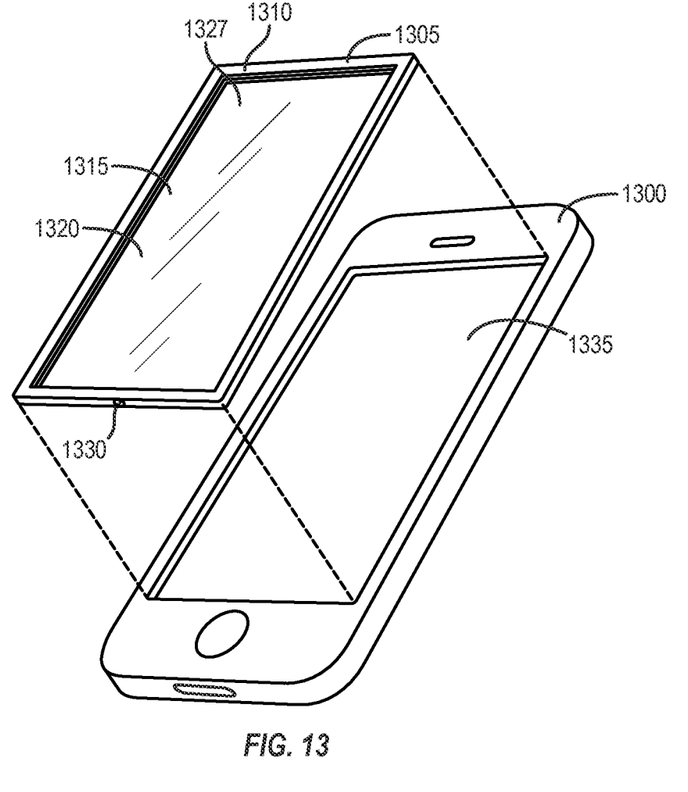
FIG. 13 illustrates an isometric view of an electronic device with a window in accordance with an embodiment of the invention.

Now referring to FIG. 13, an embodiment employing a transparent electrically conductive fluid may be employed as a transparent electromagnetic interference (EMI) shield in an electronic device 1300. The transparent EMI shield may allow it to be used over a display without obscuring the display like other types of EMI shields. Although electronic device 1300 is illustrated as a phone, the electronic device may be any type of device such as a laptop computer, a computer monitor, a camera or other device. In this embodiment, a three-dimensional transparent structure 1305 may be used as an EMI shield to protect electronic device 1300 from externally generated EMI and may also be used to keep internally generated EMI within the electronic device.

In some embodiments, structure 1305 may be made from a frame 1310 and a pair of transparent windows 1315, 1320. In some embodiments transparent windows 1315, 1320 may be made from one or more of the materials discussed above including, but not limited to, transparent polycarbonate or glass. Transparent windows 1315, 1320 and frame 1310 may form a substantially enclosed structure containing a transparent electrically conductive fluid 1327. Transparent electrically conductive fluid 1327 may be electrically connected to a ground through one or more conductive plugs 1330. Fluid 1327 may form a transparent EMI shield, effectively attenuating impinging electromagnetic energy. The thickness of the fluid, the electrical conductivity of the fluid and the type of fluid, among other parameters, may be varied to achieve effective EMI shielding while maintaining optical transparency.

In some embodiments, structure 1305 may be employed over a display screen 1335 on electronic device 1300, thus providing the ability for a user to view the display screen through the EMI shield. In other embodiments, structure 1305 may be employed over other electronic device elements such as, but not limited to, optical sensors, cameras, lights and internal components. Myriad other uses and configurations for structure 1305 are within the scope of this disclosure. For example, structure 1305 may not be two-dimensional and may be three-dimensional covering a curved display screen or other non-two-dimensional structure.

Now referring to FIG. 14, an embodiment may be employed as an antenna in an electronic device 1400. The antenna may be transparent, enabling it to be placed in front of a display screen without obscuring the user's view of the screen. Although electronic device 1400 is illustrated as a phone, the electronic device may be any type of device such as a laptop computer, a computer monitor, a camera or other device. In this embodiment, a three-dimensional transparent structure 1405 may be used as an antenna to transmit or receive information. Such antennas may be used to transmit and receive data on cellular, WiFi, Bluetooth or other bands.

In one embodiment, transparent structure 1415 may form a substantially enclosed cavity containing a transparent electrically conductive fluid 1427. Transparent structure 1415 may be made from a transparent material such as, for example, polycarbonate, silicone, acrylic, vinyl or myriad other films. Fluid 1427 may be electrically connected to an antenna circuit through one or more conductive interconnects 1420 such that it forms a transparent antenna. Conductive interconnect 1420 may be formed as discussed above using an electrically conductive plug or other method. The pattern of fluid 1427, the thickness of the fluid, the electrical conductivity of the fluid and the type of fluid, among other parameters, may be varied to achieve an effective antenna gain while maintaining optical transparency.

In some embodiments, structure 1415 may be employed over a display screen 1435 on electronic device 1400, thus providing the ability for a user to view the display screen through the antenna. In further embodiments a transparent protective screen 1440 may be placed over structure 1415 and display screen 1435. In other embodiments, structure 1405 may be employed over other electronic device elements such as, but not limited to, optical sensors, cameras and lights. Myriad other uses and configurations for structure 1405 are within the scope of this disclosure. For example, structure 1405 may not be two-dimensional and may be three-dimensional and placed on a curved display screen or other non-two-dimensional structure.

Now referring to FIG. 15, an embodiment may function as an orientation or gravitational force sensor 1500. A device may be filled with an electrically conductive liquid and based on the location of a bubble in the liquid electrical connections to conductive plugs may be made or broken, indicating a change in state or position of the sensor. Such a sensor may be used in myriad applications such as within an electronic device, a toy, an automobile or any other device that benefits from information on orientation and changes in gravitational force.

A simplified cross-section of one embodiment is illustrated in a first position in FIG. 15. Sensor 1500 may have a wall 1505 forming a substantially continuous enclosure that contains electrically conductive fluid 1527 containing a void 1530 disposed within the fluid. Wall 1505 may have one or more electrically conductive plugs 1535(1) . . . 1535(5) configured to form an electrical connection to fluid 1527. This embodiment has five conductive plugs 1535(1) . . . 1535(5) in a row, however other embodiments may have fewer or more and they may be in multiple rows, orientations and directions.

Wall 1505 may be made from an electrically insulative material. Conductive plugs 1535(1) . . . 1535(5) may be configured to make electrical contact with electrically conductive fluid 1527 or to be isolated from the fluid by void 1530 such that an orientation of sensor 1500 may be determined. More specifically, in some embodiments multiple conductive plugs 1535(1) . . . 1535(5) may be used, and by sensing which plugs are in contact with fluid 1527 and which are not, the orientation of sensor 1500 may be determined. For example, FIG. 16 illustrates sensor 1500 in a different orientation where void 1530 has moved and a different conductive plug 1535(1) . . . 1535(5) is electrically isolated from fluid 1527. As illustrated, void 1530 may change location based on an orientation of sensor 1500, however void may also change location based on the centrifugal force or magnetic field that sensor 1500 is exposed to. In particular, if fluid 1527 is magnetic, void 1530 would change location based on the location of an applied magnetic field to sensor 1500.

In some embodiments wall 1505 may be made from a transparent material while in other embodiments it may be made from a semi-transparent or an opaque material. In further embodiments fluid 1527 may be made from a transparent material while in other embodiments it may be made from a semi-transparent or an opaque material. In some embodiments a substantially transparent sensor 1500 may be beneficial such as in an application that must pass light through sensor 1500.

Figure 17:
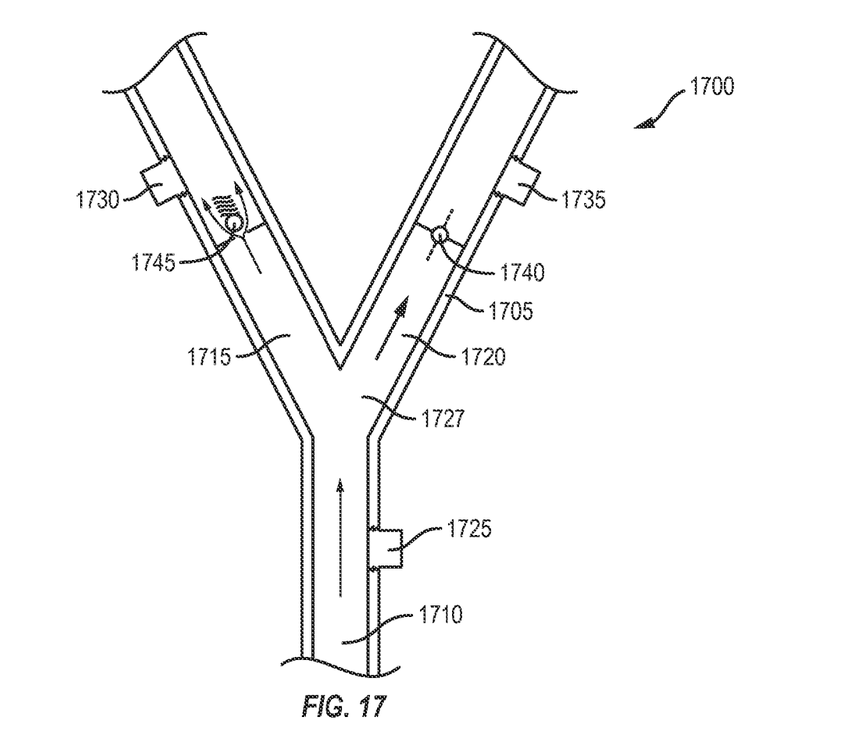
FIG. 17 illustrates a cross-sectional view of a fluid flow channel in accordance with an embodiment of the invention.

Now referring to FIG. 17, in one embodiment a channel structure 1700 may be filled with an electrically conductive fluid 1727 and be employed as a flow sensor and/or a fluid flow logic device, as described in more detail below. Structure 1700 may have one or more walls 1705 forming one or more channels 1710, 1715, 1720 configured to allow fluid 1723 to flow through them. Walls 1705 may have multiple electrically conductive plugs 1725, 1730, 1735 disposed within them. Plugs 1725, 1730, 1735 may make electrical contact with fluid 1727 and be used as feedback, as discussed as more detail below.

In some embodiments plugs 1725, 1735 may be disposed in side wall 1705 of channels 1710, 1720, respectively. Plugs 1725, 1735 may be configured to make electrical contact with fluid 1727. An electrically insulative valve 1740 may be placed in channel 1720 and configured such that in a first position fluid 1727 may flow past the valve and in a second position the valve may stop the flow of fluid and electrically isolate upstream fluid from downstream fluid. That is, when valve 1740 is in a closed position there may be little to no electrical continuity between plugs 1725 and 1735, however when the valve is open, continuity is restored. Thus, such a system can be used to create or break continuity between plugs 1725, 1735 as well as block the flow of fluid 1727.

In another embodiment, a check valve 1745 may be employed in channel 1715. Check valve 1745 may electrically isolate plug 1730 from plug 1725 and 1735 when in a closed position. However when in an open position, electrical continuity is restored between plugs 1725, 1730 and 1735. In one example embodiment, fluid 1727 may run through a filter or other device and when the pressure required to get through the filter increases beyond the pressure required for check valve 1745 to open, the check valve opens. The open check valve allows electrically conductive fluid 1727 to flow past plug 1730 creating electrical continuity between plugs 1725, 1730 and 1735.

In further embodiments, an electrical logic system may be used to detect continuity between plugs 1725, 1730 and 1735 and notify an operator that check valve 1745 has opened. In another illustrative example, check valve 1745 may be used to determine the direction of flow of fluid 1727. For example, in one embodiment if fluid 1727 is flowing from plug 1725 towards plug 1730 then check valve 1745 will be open and electrical continuity will be measured between the plugs. However, if fluid 1727 is flowing from plug 1730 to plug 1725 check valve 1745 will be closed and there will be no electrical continuity between plugs 1725 and 1730. Similarly, continuity between plugs 1725 and 1735 may be used to determine position of valve 1740. If there is continuity then valve 1740 is open and if there is no continuity then the valve is closed.

In some embodiments wall 1705 may be made from a transparent material while in other embodiments it may be made from a semi-transparent or an opaque material. In further embodiments fluid 1727 may be made from a transparent material while in other embodiments it may be made from a semi-transparent or an opaque material. In some embodiments a substantially transparent structure 1700 may be beneficial such as in an application that must pass light through the structure.

Myriad uses and other configurations are within the scope of this disclosure. For example, in some embodiments, laminar flow fluid channels may be used to form electrical circuits. In one embodiment, three parallel streams of fluid flow into a common unified channel. In a further embodiment, a conductive stream may be disposed on either side of a non-conductive stream. As long as the flow is laminar and the conductive stream continues to flow the first and second conductive streams may remain electrically isolated. However, in some embodiments, if one or more of the streams transitions to turbulent flow and/or the non-conductive stream is shut off, the conductive streams may combine and electrical continuity between the two conductive streams may result.

Figure 18:
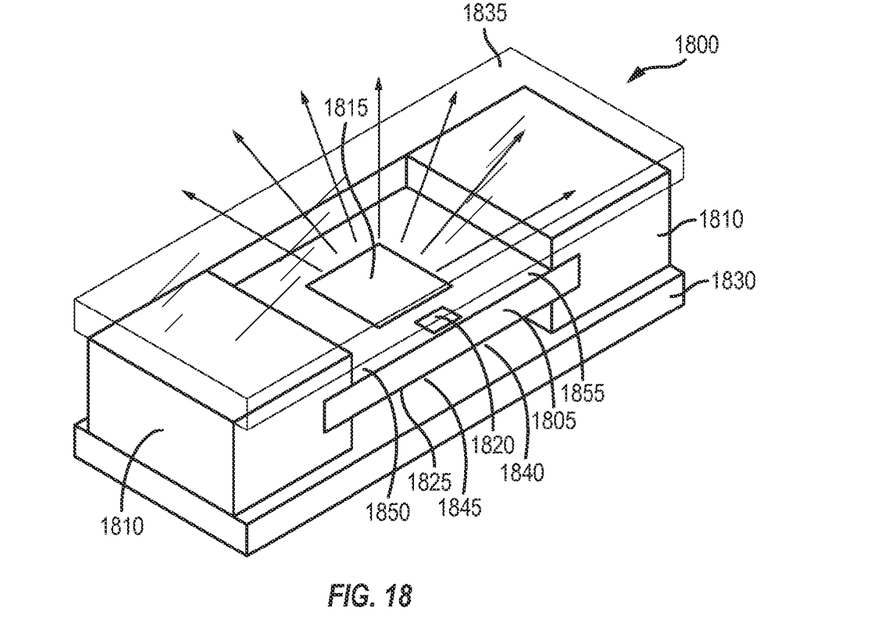
FIG. 18 illustrates a partially transparent isometric view of an LED mount in accordance with an embodiment of the invention.

Now referring to FIG. 18, an embodiment may use an electrically conductive transparent fluid for forming an electrical connection to an electronic device as well as for cooling. In this embodiment electrically conductive fluid flows over an light emitting diode (LED) die, making electrical contact with the LED die while simultaneously cooling it. The electrically conductive fluid that flows over the top of the die is transparent, allowing the LED to emit light through the fluid.

A simplified isometric view of structure 1800 is illustrated in FIG. 18 and includes a LED die 1805 held on either side by electrically insulative supports 1810. LED die 1805 has an emission aperture 1815, a first electrical contact 1820 and a backside 1825 which is also a second electrical contact. Structure 1800 further has a lower cover 1830 which may be opaque and an upper cover 1835 which may be transparent or translucent. Lower cover 1830 in combination with supports 1810 forms a first channel 1840 that may contain a first electrically conductive fluid 1845. Upper cover 1835 in combination with supports 1810 forms a second channel 1850 that may contain an electrically conductive and transparent or translucent second fluid 1855. Fluids 1845, 1855 may be connected to one or more pumping device such that they flow through channels 1840, 1850, respectively.

LED die 1805 may emit light from emission aperture 1815 when a voltage potential is applied between first electrical contact 1820 and backside 1825. First fluid 1845 may be at a first voltage potential and in electrical contact with backside 1825. Second fluid 1855 may be at a second voltage potential and in electrical contact with first electrical contact 1820. Thus, first and second fluids, 1845, 1855, respectively may not only flow across LED die 1805, but may also apply the necessary voltage potential to the LED die to make it emit light. Further, the flow of first and second fluids 1845, 1855, respectively across LED die 1805 may provide cooling to maintain the temperature of the LED die below its maximum operating temperature. Yet further, the translucent or transparent nature of second fluid 1855, enables LED die 1805 to emit light through the second fluid and through second cover 1835. Such embodiments may enable direct liquid cooling of high power LED's without a need for forming wired electrical connections to LED die 1805. Other embodiments may use different geometries or configurations and are within the scope of this disclosure.

Figure 19:
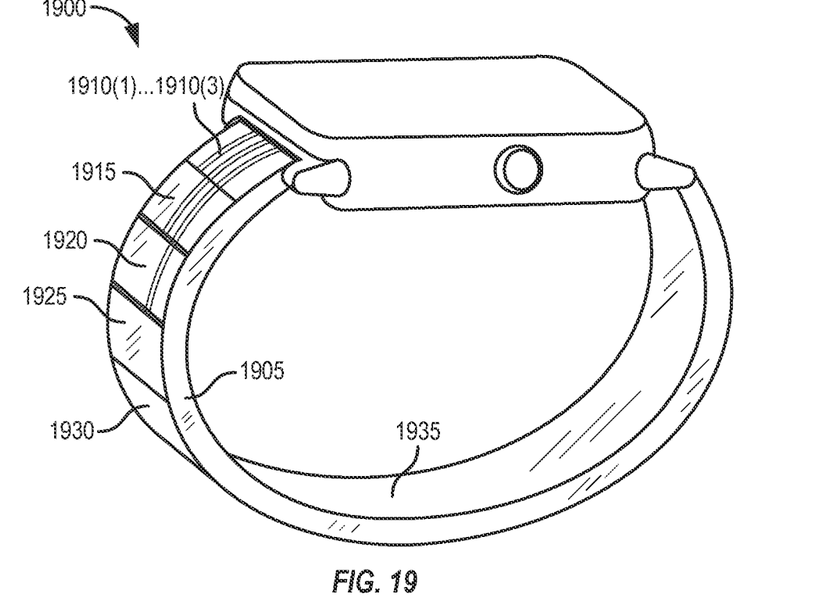
FIG. 19 illustrates an isometric view of a wearable device in accordance with an embodiment of the invention.

Referring now to FIG. 19, some embodiments may employ a transparent liquid crystal fluid to make a structure change color. As an example, wearable device 1900 may be similar to wearable device 500 (see FIG. 5) having a transparent or translucent band 1905 that may contain one or more electrically conductive channels 1910(1) . . . 1910(3). However, wearable device 1900 may have one or more illuminated portions that change color, as described in more detail below.

Band 1905, may have one or more enclosed interior cavities 1915, 1920, 1925. In some embodiments, cavities 1915, 1920, 1925 may each have a first wall 1930 oriented parallel to a second wall 1935. In one embodiment, first wall 1930 may contain a light source and second wall 1930 may contain a polarization filter and/or a color filter. An optically transparent fluid (not shown) may be disposed within the one or more enclosed interior cavities 1915, 1920, 1925. The fluid may be configured to change its crystalline orientation under an applied voltage such that in a first orientation light from the light source may pass through the fluid with relatively little effect and in a second orientation the fluid may change a polarization of the light.

For example, in one embodiment first wall 1935 may contain a white light source such as, for example, an LED. The white light source may be configured to emit light through a first polarizer, then through the liquid crystal fluid towards second wall 1930, oriented parallel to the first wall. In some embodiments the fluid may be a liquid crystal type of fluid that may be a twisted nematic or a super twisted nematic or other type. Second wall 1930 may have one or more polarizers and/or color filters.

In some embodiments, this configuration may enable band 1905 to be illuminated with one or more colors. In further embodiments, band 1905 may only have one fluid compartment and one color filter. In other embodiments, band 1905 may have numerous individual compartments with different color filters (e.g., red, green and blue) on the compartments such that the color of the object may be changed. For example, if a red color is illuminated adjacent to a blue color, the object may appear to be purple.

Figure 20:
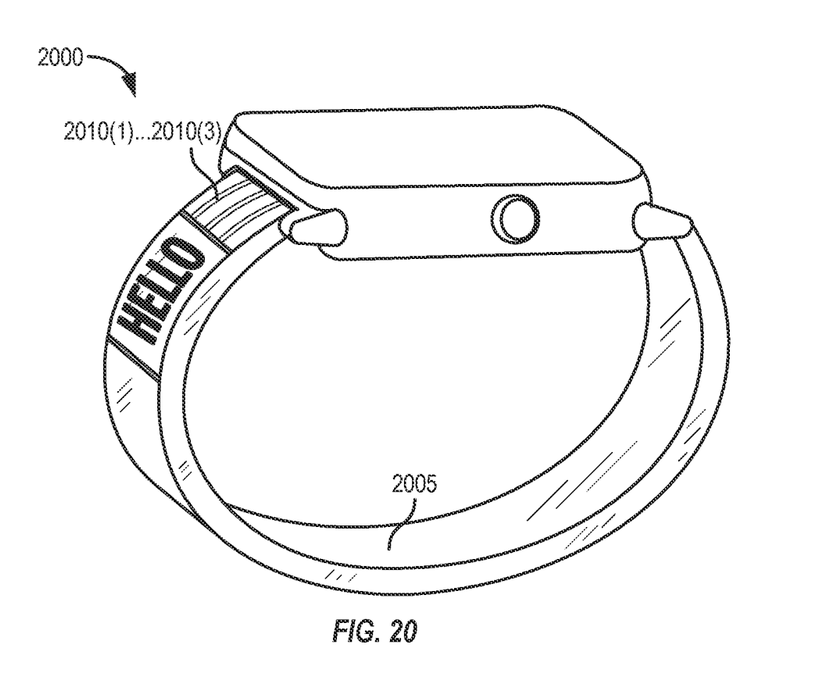
FIG. 20 illustrates an isometric view of a wearable device in accordance with an embodiment of the invention.

Now referring to FIG. 20, another example of an embodiment that may use a transparent liquid crystal fluid to make a structure change color is illustrated. Wearable device 2000 is similar to wearable device 1900 (see FIG. 19) having a transparent or translucent band 2005 that may contain one or more electrically conductive channels 2010(1) . . . 2010(3). However, wearable device 2000 may have a relatively large number of comparatively small compartments such that the apparatus can display messages, images and/or myriad colors, as described in more detail below.

The mechanism that displays the colors and/or messages may be the same as employed in wearable device 1900, however the size of the interior cavities may be substantially smaller. Further, the particular colors and/or the images generated by wearable device 1900 may be aesthetically appealing and may be difficult to achieve with other technologies. For example, in one embodiment the colors and tones are somewhat muted and may appear to be more of a glow than a bright illumination. In some embodiments these features may be used as an indicator to a user who may have the device on or near them.

In some embodiments combinations of the embodiments described above may be used. For example, in one embodiment a wearable device band may have one or more portions that change color. In some embodiments the one portion may change color from transparent to red when there is an incoming call. That same portion may also be a touch sensitive user input device such that a user may answer the call by touching the portion that changed color. In further embodiments a user may program portions to be various different colors corresponding to different commands. By touching that particular color the wearable device may execute a particular command associated with that color. Myriad other combinations of features and functions discussed herein are within the scope of this disclosure.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A flexible apparatus comprising:
   an optically transparent and flexible shell forming an interior cavity;
   a first and a second electrically conductive plug disposed through the shell;
   an electrically conductive fluid disposed within the enclosed interior cavity such that the electrically conductive fluid contacts the first and the second electrically conductive plugs and forms an electrical connection between the first and the second electrically conductive plugs.

2. The flexible apparatus of claim 1 wherein the fluid is optically transparent.

3. The flexible apparatus of claim 1 wherein an electrical resistance between the first and second electrically conductive plugs changes when the shell is deflected.

4. The flexible apparatus of claim 1 wherein the fluid is configured to operate as a conductive element of a capacitive sensor such that the sensor can detect when a user touches the shell.

5. The flexible apparatus of claim 1 wherein the fluid has a void that can be positioned on the first electrically conductive plug such that the fluid is not in electrical contact with the first electrically conductive plug.

6. The flexible apparatus of claim 1 wherein the fluid flows through the interior cavity and an insulative valve having a first position where the fluid flows past the valve and a second position where the valve stops the flow of the fluid and electrically isolates the fluid on an upstream side of the valve from the fluid on a downstream side of the valve.

7. The flexible apparatus of claim 1 wherein the fluid is electrically connected to a ground and functions as an electromagnetic interference shield.

8. The flexible apparatus of claim 1 wherein the fluid is coupled to an antenna circuit and functions as an antenna.

9. A transparent circuit comprising:
   a shell that is transparent to optical signals;
   at least one interior cavity formed within the shell;
   an electrically conductive fluid that is transparent to the optical signals and is disposed within the at least one interior cavity and;
   a first and a second electrically conductive plug disposed through the shell and configured to be in contact with the electrically conductive fluid.

10. The transparent circuit of claim 9 wherein the shell is placed in front of an optical sensor and the optical sensor emits or receives optical signals through the transparent circuit.

11. The transparent circuit of claim 9 wherein the electrically conductive fluid acts as a conductive element of a capacitive sensor such that the sensor can detect when a user touches the shell.

12. The transparent circuit of claim 9 wherein the shell is made from a flexible material.

13. The transparent circuit of claim 9 wherein the shell has a first end and a second end with the at least one interior cavity extending from the first end to the second end and the first electrically conductive plug is secured in the first end and the second electrically conductive plug is secured in the second end such that the at least one interior cavity is sealed forming an electrically conductive channel between the first and the second electrically conductive plugs.

14. The transparent circuit of claim 9 wherein the shell and the fluid are made from optically transparent materials.

15. The transparent circuit of claim 9 wherein the fluid is configured to flow through the interior cavity.

16. The transparent circuit of claim 15 wherein the interior cavity has an electrically insulative valve and the first electrically conductive plug is on a downstream side of the valve and the second electrically conductive plug is on an upstream side of the valve.

17. The transparent circuit of claim 16 wherein the valve is a check valve.

18. An apparatus comprising:
   an optically transparent shell having one or more enclosed interior cavities, each of the one or more cavities having a first wall oriented parallel to a second wall, the first wall containing a light source and the second wall containing a polarization filter;
   an optically transparent fluid disposed within the one or more enclosed interior cavities, the fluid configured to change its crystalline orientation under an applied voltage such that in a first orientation light may pass through the fluid with relatively little effect and in a second orientation the fluid may polarize the light.

19. The apparatus of claim 18 wherein the second wall comprises a color filter.

20. The apparatus of claim 19 wherein the light source is a white light source.

* * * * *